(12) United States Patent
Ahn et al.

(10) Patent No.: US 11,849,611 B2
(45) Date of Patent: Dec. 19, 2023

(54) METHOD FOR MANUFACTURING DISPLAY PANEL INCLUDING FORMING THROUGH HOLE USING UPPER MASK AND LOWER MASK

(71) Applicant: Samsung Display Co., Ltd., Yongin-Si (KR)

(72) Inventors: Yi Joon Ahn, Seoul (KR); Eun-Kyung Yeon, Suwon-si (KR); Jaebeen Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 169 days.

(21) Appl. No.: 17/322,978

(22) Filed: May 18, 2021

(65) Prior Publication Data
US 2022/0052146 A1   Feb. 17, 2022

(30) Foreign Application Priority Data
Aug. 13, 2020   (KR) .......................... 10-2020-0102038

(51) Int. Cl.
  *H10K 59/131*   (2023.01)
  *H01L 25/18*    (2023.01)
  *H10K 71/00*    (2023.01)
  *H10K 77/10*    (2023.01)
  *H10K 59/12*    (2023.01)

(52) U.S. Cl.
CPC ........... *H10K 59/131* (2023.02); *H01L 25/18* (2013.01); *H10K 71/00* (2023.02); *H10K 77/10* (2023.02); *H10K 59/1201* (2023.02)

(58) Field of Classification Search
CPC .. H10K 59/12; H10K 59/1201; H10K 59/131; H10K 71/00; H10K 71/40; H10K 71/421; H10K 71/441; H10K 77/10
USPC .......................................................... 257/88
See application file for complete search history.

(56) References Cited

U.S. PATENT DOCUMENTS

| | | | |
|---|---|---|---|
| 9,933,644 B2 * | 4/2018 | Kim | G02F 1/13336 |
| 10,454,048 B2 | 10/2019 | Jeong | |
| 10,593,743 B2 | 3/2020 | Son et al. | |
| 2018/0123088 A1 * | 5/2018 | Kim | H10K 50/8426 |
| 2018/0149942 A1 * | 5/2018 | Harris | G02F 1/1345 |
| 2020/0136095 A1 * | 4/2020 | Ju | H10K 71/00 |
| 2021/0074798 A1 | 3/2021 | Kim et al. | |
| 2021/0296373 A1 | 9/2021 | Yeon et al. | |

FOREIGN PATENT DOCUMENTS

| | | |
|---|---|---|
| JP | 6320713 | 5/2018 |
| KR | 10-2015-0145827 | 12/2015 |
| KR | 10-2018-0079078 | 7/2018 |
| KR | 10-2021-0030539 | 3/2021 |
| KR | 10-2021-0117380 | 9/2021 |

* cited by examiner

*Primary Examiner* — Matthew E. Gordon
(74) *Attorney, Agent, or Firm* — F. Chau & Associates, LLC

(57) ABSTRACT

A display panel including: a substrate having a through hole, a conductive part disposed on an inner surface of the through hole and a resin part in the through hole and adjacent to the conductive part; a circuit layer disposed at a first side of the substrate; and a pad disposed at a second side of the substrate and electrically connected to the circuit layer by the conductive part, wherein a width of the through hole is larger near the first side or the second side of the substrate than at a center of the through hole.

13 Claims, 12 Drawing Sheets

METHOD FOR MANUFACTURING DISPLAY PANEL INCLUDING FORMING THROUGH HOLE USING UPPER MASK AND LOWER MASK

CROSS-REFERENCE TO RELATED APPLICATION

This U.S. non-provisional patent application claims priority under 35 U.S.C. § 119 to Korean Patent Application No. 10-2020-0102038, filed on Aug. 13, 2020, the disclosure of which is incorporated by reference herein in its entirety.

TECHNICAL FIELD

The inventive concept disclosed herein relates to a display panel, a method for manufacturing the same, and a display device including the display panel, and more particularly, to a display panel having a reduced non-display area, a method for manufacturing the same, and a display device including the display panel.

DISCUSSION OF RELATED ART

A display device is output device for display of information in visual form. The display device may include at least one display panel. The display panel may include a display area and a non-display area surrounding the display area. The non-display area may form at least a part of a bezel of the display device. The display area may include a plurality of light emitting elements, and the non-display area may include a driving chip for driving the light emitting elements.

When the light emitting elements and the driving chip are disposed on the same layer, the display panel may include the non-display area. The non-display area may, however, degrade display quality of the display device when its driving chip is located at the same layer as the light emitting elements.

SUMMARY

An embodiment of the inventive concept provides a display panel including: a substrate having a through hole, a conductive part disposed on an inner surface of the through hole and a resin part in the through hole and adjacent to the conductive part; a circuit layer disposed at a first side of the substrate; and a pad disposed at a second side of the substrate and electrically connected to the circuit layer by the conductive part, wherein a width of the through hole is larger near the first side or the second side of the substrate than at a center of the through hole.

The display panel may further include an auxiliary conductive part extending from the conductive part along the second side of the substrate.

When viewed in a cross section parallel to a thickness direction of the substrate, a width of the conductive part may be smaller than a width of the resin part.

A width of the resin part when viewed in a cross section parallel to a thickness direction of the substrate may be about 40 μm to about 200 μm.

The display panel may include a driving chip disposed at the second side of the substrate and connected to the pad.

The resin part may include an epoxy-based resin.

An embodiment of the inventive concept provides a method for manufacturing a display panel, the method including: forming a through hole in a base substrate; providing metallic ink to an inner surface of a through hole passing through a base substrate to form a conductive part; filling the inside of the conductive part with a polymer resin to form a resin part; forming a circuit layer at an upper side of the base substrate; and forming a pad at a lower side of the base substrate, wherein the pad overlaps the through hole, wherein the forming of the through hole in the base substrate includes: arranging a mask including a transmission part and a non-transmission part at each of upper and lower sides of a preliminary base substrate; forming the through hole in the preliminary base substrate, wherein the through hole corresponds to the transmission part; and removing the mask.

An area of the transmission part of the mask at the lower side of the preliminary base substrate may be larger than an area of the transmission part of the mask at the upper side of the preliminary base substrate.

When viewed in a plane, the transmission part may include a first transmission part that has a portion with a circumference having a first radius of curvature.

The transmission part may further include a second transmission part having a square shape when viewed in a plane, and the second transmission part is connected at one side of the first transmission part.

The mask at the lower side of the preliminary base substrate may include the first transmission part and the second transmission part, and the mask at the upper side of the preliminary base substrate may include the first transmission part.

The mask at the upper side of the preliminary base substrate may not include the second transmission part.

When viewed in a cross section perpendicular to the thickness direction of the preliminary base substrate, one edge of the mask at the upper side of the preliminary base substrate and one edge of the mask at the lower side of the preliminary base substrate may overlap.

A second width of the transmission part of the mask at the lower side of the preliminary base substrate may be three to five times greater than a first width of the transmission part of the mask at the upper side of the preliminary base substrate, and the first width and the second width each correspond to a width in a direction perpendicular to the thickness direction of the preliminary base substrate.

When viewed in a plane, an area of the through hole may be smaller than an area of the transmission part.

The forming of the through hole may include forming a preliminary through hole with a laser and etching the preliminary through hole.

When viewed in a plane, the preliminary through hole may be circular and has an average diameter of about 0.1 um to about 10 um.

The metallic ink may include a conductive material and a solvent, and the forming of the conductive part may include removing the solvent.

The forming of the conductive part may further include performing plasma treatment on the inner surface of the through hole.

An embodiment of the inventive concept provides a display device including: a plurality of display panels adjacent to each other, wherein the display panels each include: a substrate having at least one through hole passing therethrough and including a conductive part disposed on an inner surface of the through hole and a resin part filling the through hole inside the conductive part; a circuit layer disposed at a first side of the substrate; and at least one pad disposed at a second side of the substrate and electrically connected to the circuit layer through the conductive part, wherein the at least one pad overlaps a display area of the display panel.

An embodiment of the inventive concept provides a display panel including: a substrate including a first side and a second side opposite the first side, wherein a through hole passes through the substrate; a pad disposed on the second side of the substrate; a light emitting element disposed on the first side of the substrate, wherein the pad is electrically connected to the light emitting element by a conductive part in the through hole.

The conductive part may include a first conductive part formed on a first sidewall of the through hole and a second conductive part formed on a second sidewall of the through hole.

A resin may be disposed between the first and second sidewalls of the through hole.

The first conductive part may be connected to an auxiliary conductive part extending along the second side of the substrate and arranged between the second side of the substrate and the pad.

The display panel may further include a driving chip arranged at the second side of the substrate and electrically connected to the pad.

BRIEF DESCRIPTION OF THE FIGURES

The above and other features of the inventive concept will become more apparent by describing in detail embodiments thereof with reference to the accompanying drawings. In the drawings.

DETAILED DESCRIPTION OF THE EMBODIMENTS

Figure 1:
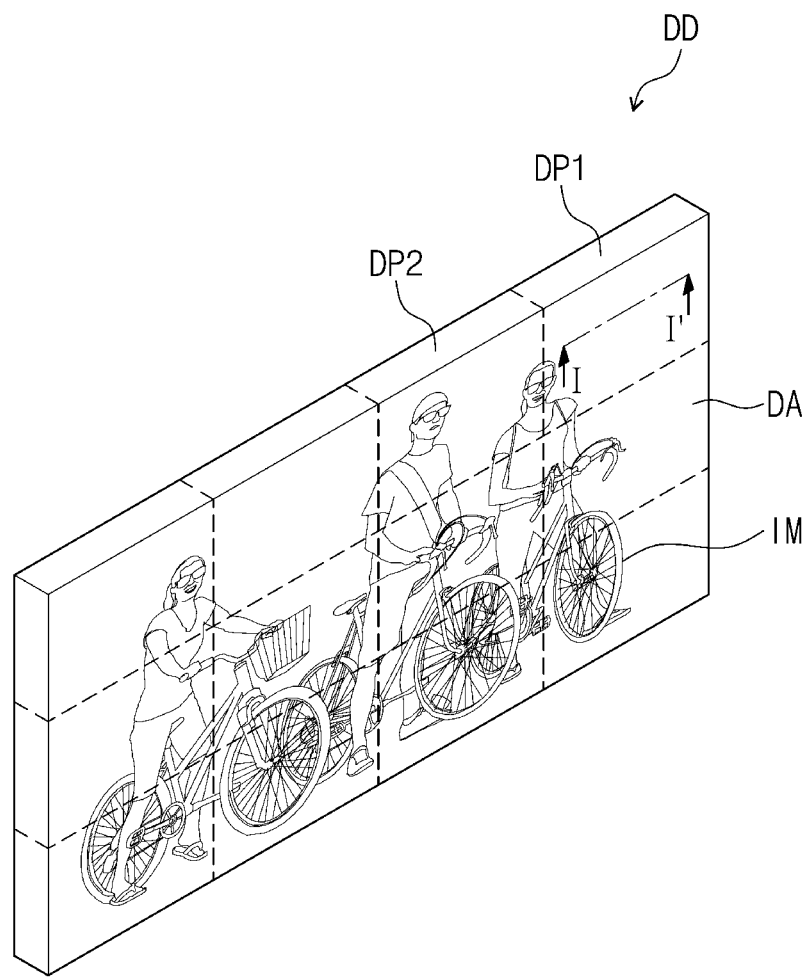
FIG. 1 is a perspective view illustrating a display device according to an embodiment of the inventive concept.

In the present description, when an element (or a region, a layer, a portion, etc.) is referred to as being "on," "connected to," or "coupled to" another element, it may mean that the element is directly disposed on/connected to/coupled to the other element, or that a third element is disposed therebetween.

Like reference numerals may refer to like elements. In addition, in the drawings, the thickness, the ratio, and the dimensions of elements may be exaggerated for an effective description of technical contents.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element. The terms of a singular form may include plural forms unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

Hereinafter, embodiments of the inventive concept will be described with reference to the accompanying drawings.

FIG. 1 is a cross-sectional view illustrating a display device DD according to an embodiment of the inventive concept. The display device DD may be a large-sized electronic device such as a television set, a monitor or an outdoor billboard. The display device DD may be a tiled display including a plurality of display panels DP1 and DP2. However, these are merely presented as examples, and the display device DD may thus be adopted for use with other electronic devices. In addition, descriptions of a display panel DP according to an embodiment of the inventive concept, which will be described later, may be equally applied to each of the plurality of display panels DP1 and DP2.

In the display device DD, the plurality of display panels DP1 and DP2 may be disposed in parallel when viewed in a plane. One edge of the display panels DP1 and DP2 may be in contact with each other. For example, the display panels DP1 and DP2 may be arranged side by side.

The display device DD may include a display area DA for displaying an image IM. The display area DA may be parallel to a plane formed by a first directional axis DR1 and a second directional axis DR2 crossing the first directional axis DR1. The display device DD may include the display area DA, but may not include a non-display area. In other words, the display device DD according to an embodiment of the inventive concept may include the display panels DP, DP1, and DP2, and no non-display area. Accordingly, the display device DD may have increased display quality.

The display device DD may have a three-dimensional shape having a predetermined thickness in a direction of a third directional axis DR3, which is the direction perpendicular to the plane formed by the first directional axis DR1 and the second directional axis DR2 crossing the first directional axis DR1. The first directional axis DR1, the second directional axis DR2 and the third directional axis DR3 may be referred to as first, second and third directions, respectively. In the present description, an upper surface (or a front surface) and a lower surface (or a rear surface) of respective members are described with respect to the direction in which the image IM is displayed in the display area DA. The upper and lower surfaces may oppose each other with respect to the third directional axis DR3, and the normal direction of each of the upper and lower surfaces may be parallel to the third directional axis DR3. It is to be understood, however, that the directions indicated by the first to third directional axes DR1, DR2, and DR3 are relative concepts, and may thus be changed to other directions. Hereinafter, the first to third directions correspond to directions indicated by the first to third directional axes DR1, DR2, and DR3, respectively, and are given the same reference numerals.

Figure 2:
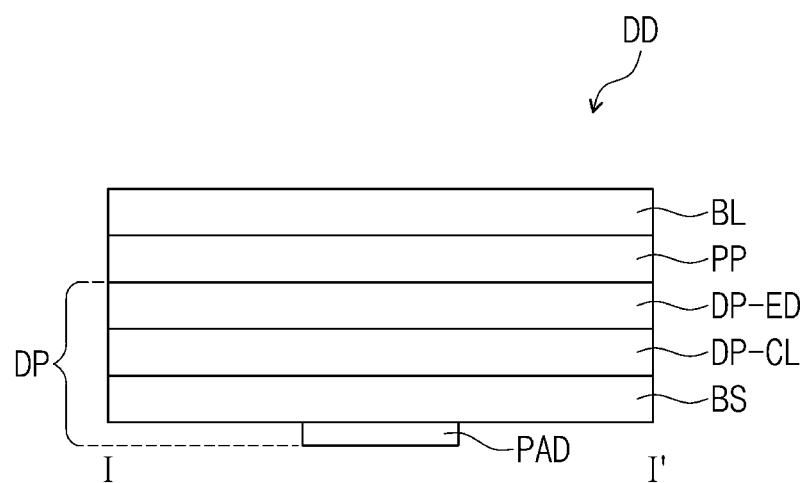
FIG. 2 is a cross-sectional view illustrating a portion corresponding to line I-I' of FIG. 1.
Figure 2:
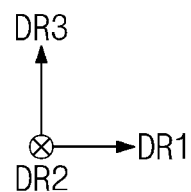
Figure 3:
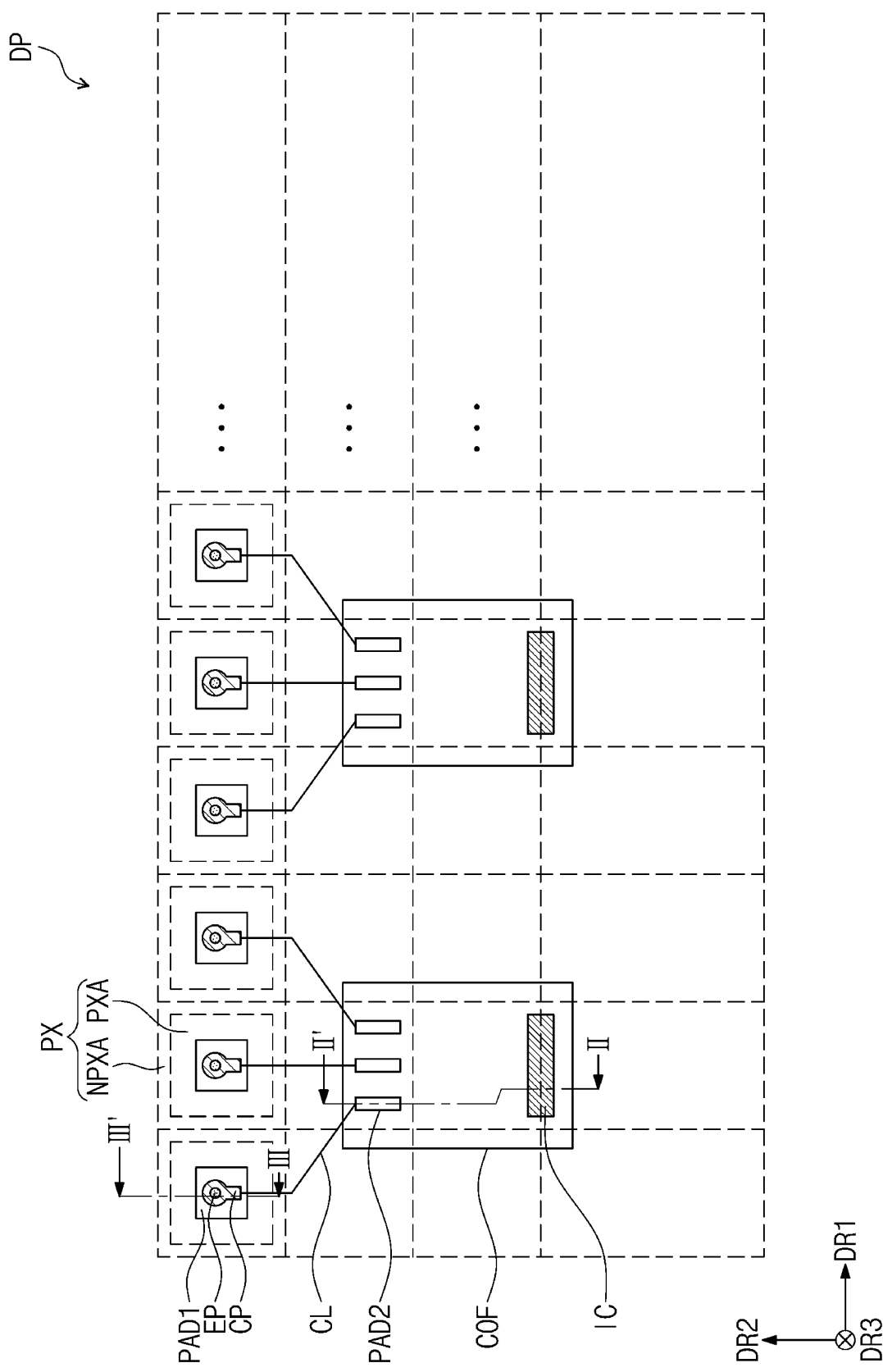
FIG. 3 is a plan view illustrating a display panel according to an embodiment of the inventive concept.
Figure 4:
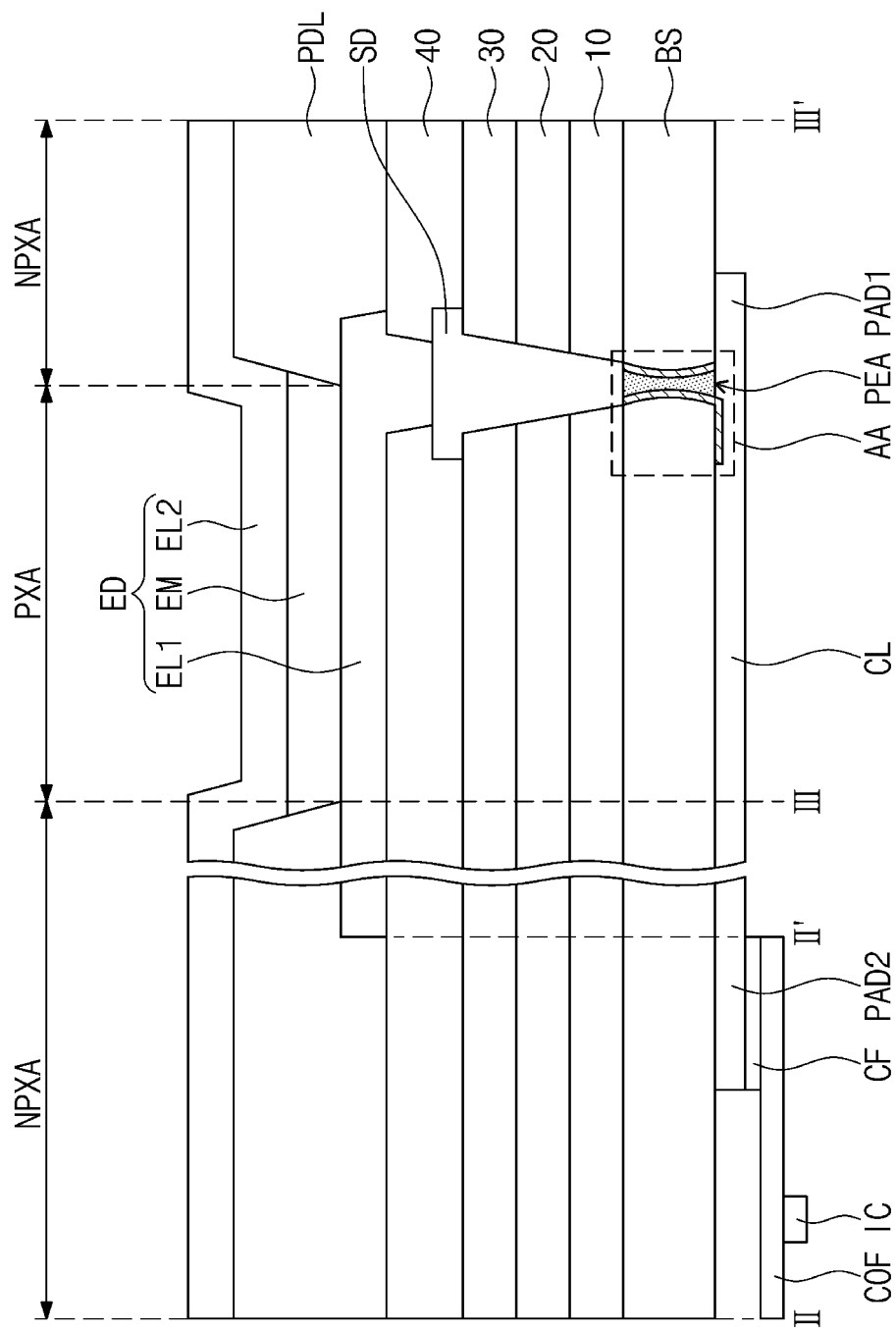
FIG. 4 is a cross-sectional view illustrating portions corresponding to lines II-II' and of FIG. 3.
Figure 5:
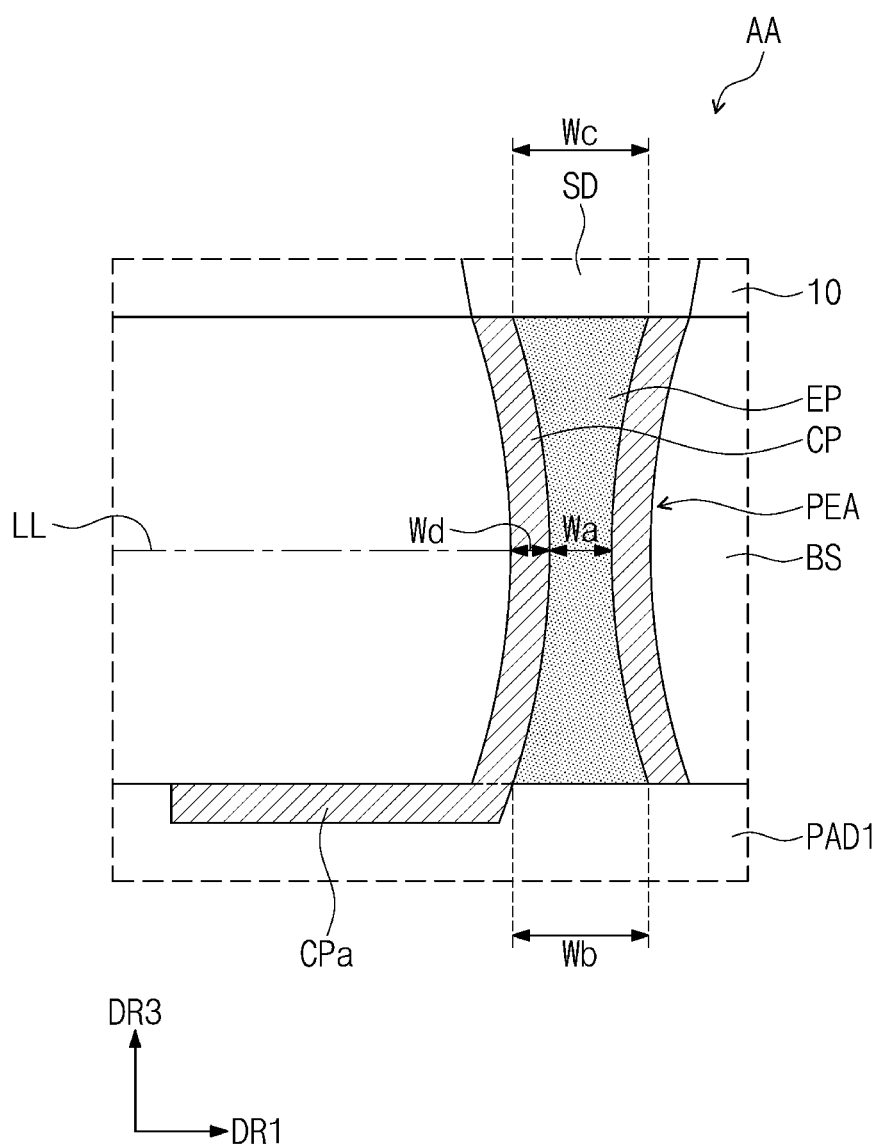
FIG. 5 is a cross-sectional view enlarging area AA of FIG. 4.

FIG. 2 is a cross-sectional view illustrating a portion corresponding to line I-I' of FIG. 1. FIG. 3 is a cross-sectional view illustrating a display panel according to an embodiment of the inventive concept. FIG. 4 is a cross-sectional view illustrating portions corresponding to lines II-II' and of FIG. 3. FIG. 5 is a cross-sectional view enlarging area AA of FIG. 4.

The display panel DP according to an embodiment of the inventive concept may include a base substrate BS, a circuit layer DP-CL disposed at a first side of the base substrate BS, and a pad PAD disposed at a second side of the base substrate BS. For example, the first side may be an upper side of the base substrate BS and the second side may be a lower side of the base substrate BS. The base substrate BS may have at least one through hole PEA. For example, the through hole PEA may penetrate the base substrate BA and pass from the upper side of the base substrate BS to a lower side of the base substrate BS. A conductive part CP may be disposed on an inner surface of the through hole PEA, and the inside of the conductive part CP may be filled with a resin part EP. For example, the conductive part CP may be disposed on opposite sidewalls of the through hole PEA with the resin part EP provided therebetween. The through hole PEA, the conductive part CP, and the resin part EP will be described in more detail later.

Referring to FIG. 2, the display device DD may include the display panel DP according to an embodiment of the inventive concept. In addition, the display device DD may include an optical layer PP disposed on the display panel DP and a sub-substrate BL disposed on the optical layer PP. The sub-substrate BL may be a polymer substrate, a plastic substrate, a glass substrate, a quartz substrate, etc. The sub-substrate BL may be a transparent insulating substrate. The sub-substrate BL may be rigid or flexible.

The optical layer PP may be disposed at a lower side of the sub-substrate BL and at an upper side of the display panel DP. The optical layer PP may be disposed on the display panel DP to control light reflected from the display panel DP due to external light. For example, the optical layer PP may include a polarizing layer or a color filter layer. When the optical layer PP includes a color filter layer, the color filter layer may include quantum dots. The color filter layer may convert or transmit a color of light emitted from a display element layer DP-ED. In an embodiment of the inventive concept, the optical layer PP may be omitted.

The display panel DP may include the base substrate BS, the circuit layer DP-CL disposed at an upper side of the base substrate BS, and at least one pad PAD disposed at a lower side of the base substrate BS. In addition, the display panel DP may include the display element layer DP-ED disposed on the circuit layer DP-CL.

The display element layer DP-ED may be disposed between the circuit layer DP-CL and the optical layer PP. The display element layer DP-ED may be disposed at a lower side of the optical layer PP. The display element layer DP-ED may include a plurality of light emitting elements ED (FIG. 4). The circuit layer DP-CL may be disposed on the base substrate BS, and may include a plurality of transistors. The circuit layer DP-CL may include a driving transistor and a switching transistor for driving the light emitting elements ED (FIG. 4) of the display element layer DP-ED. In addition, the circuit layer DP-CL may include a plurality of insulating layers 10, 20, 30, and 40 (FIG. 4).

A plurality of pads PAD may be disposed at the lower side of the base substrate BS. The plurality of pads PAD may be driving pads. The pads PAD may be electrically connected to the circuit layer DP-CL. The pads PAD may be electrically connected to the transistors of the circuit layer DP-CL. The pads PAD may include a first pad PAD1 and a second pad PAD2, which will be described later.

FIG. 3 illustrates a plan view as viewed from a lower side of the display panel DP, and illustrates a state viewed from a direction opposite to the direction in which the third directional axis DR3 extends. The upper surface of the display panel DP may correspond to the display area DA of the display device DD. FIG. 3 illustrates a lower surface of a display panel DP, and the lower surface of the display panel DP and the upper surface of the display panel DP may be spaced apart in the direction in which the third directional axis DR3 extends. The upper and lower surfaces of the display panel DP each may be parallel to a plane formed by the first directional axis DR1 and the second directional axis DR2 perpendicular to the first directional axis DR1.

FIG. 3 may correspond to a lower surface of the display panel DP. The lower surface of the display panel DP may correspond to the lower surface of the base substrate BS. The pads PAD1 and PAD2 may be disposed on the lower surface of the base substrate BS. Each of the pads PAD1 and PAD2 may be connected to a connection line CL. One end of the connection line CL may be connected to the first pad PAD1, and the other end of the connection line CL may be connected to the second pad PAD2. For example, a first end of the connection line CL may be connected to the first pad PAD1 and a second end of the connection line CL may be connected to the second pad PAD2. The second pad PAD2 may be connected one-to-one to the connection line CL. Each of the first and second pads PAD1 and PAD2 may be provided in plural.

The display panel DP may include a plurality of pixels PX. The plurality of pixels PX each may emit light in different wavelength ranges. Any one of the plurality of pixels PX may emit light of a first color, another may emit light of a second color, and the other may emit light of a third color. Alternately, all of the pixels PX may emit light of the same color.

Each of the pixels PX may include a light emitting area PXA and a non-light emitting area NPXA. The light emitting element ED (FIG. 4) of the display element layer DP-ED, which will be described later, may be disposed in the light emitting area PXA. The light emitting element ED may not be disposed in the non-light emitting area NPXA.

Referring to FIG. 4, the connection line CL may be disposed at the lower side of the base substrate BS. The connection line CL may be connected to the first pad PAD1 and the second pad PAD2. The connection line CL, the first pad PAD1, and the second pad PAD2 may each be directly disposed at the lower side of the base substrate BS. The connection line CL, the first pad PAD1, and the second pad PAD2 may be disposed on the same layer.

In a conventional display panel, a connection line, a first pad, a second pad, a chip-on film, and a driving chip are disposed on the same layer along with the circuit layer. The connection line, the first pad, the second pad, the chip-on film, and the driving chip are disposed in a non-display area of the display panel. The non-display area of the display panel corresponds to the non-display area of the display device, and the non-display area of the display panel configured this may degrade display quality of a display device.

In the display panel DP according to an embodiment of the inventive concept, the connection line CL, the first pad PAD1, the second pad PAD2, a chip-on film COF, and a driving chip IC may be disposed on the lower surface of the base substrate BS. In the display panel DP according to an embodiment of the inventive concept, the connection line CL, the first pad PAD1, the second pad PAD2, the chip-on film COF, and the driving chip IC may overlap a display area of the display panel DP. The display area of the display panel DP may correspond to the display area DA of the display device DD. Accordingly, the display panel DP according to an embodiment of the inventive concept may not include a non-display area. In addition, the display device DD including the display panel DP according to an embodiment of the inventive concept may have a reduced non-display area.

The connection line CL may include a conductive material. For example, the connection line CL may include any one among molybdenum (Mo), aluminum (Al), chromium (Cr), gold (Au), titanium (Ti), nickel (Ni), neodymium (Nd), and copper (Cu), or an alloy thereof. The connection line CL may be formed as a single layer. Alternatively, the connection line CL may be formed as multiple layers. One end of the connection line CL may be connected to the first pad PAD1, and the other end of the connection line CL may be connected to the second pad PAD2. The first pad PAD1 and the second pad PAD2 may correspond to the pad PAD (FIG. 2) according to an embodiment of the inventive concept.

The chip-on film COF may be disposed at a lower side of the second pad PAD2. The chip-on-film COF may extend from the lower side of the second pad PAD2 to form a gap between the chip-on-film COF and the base substrate BS. The second pad PAD2 and the chip-on film COF may be bonded through a conductive film CF. The conductive film CF may be an anisotropic conductive film. However, this is presented as an example, and the second pad PAD2 and the chip-on film COF may be bonded through a non-conductive film. The driving chip IC may be mounted on one surface of the chip-on film COF. Alternately, in another embodiment of the inventive concept, the chip-on film COF may be omitted, and the driving chip IC may be connected to the second pad PAD2 through the conductive film CF. When the chip-on film COF is omitted, the driving chip IC and the second pad PAD2 may overlap each other.

The plurality of insulating layers 10, 20, 30, and 40, and a connection electrode SD may be disposed at the upper side of the base substrate BS. A buffer layer may be disposed between the base substrate BS and the first insulating layer 10.

The connection electrode SD may pass through the insulating layers 10, 20, 30, and 40. The circuit layer DP-CL and the display element layer DP-ED may be electrically connected through the connection electrode SD. In FIG. 4, only one connection electrode SD is shown, but the inventive concept is not limited thereto, and the connection electrode SD may be provided in plural. When a plurality of connection electrodes are provided, the connection electrodes may overlap each other.

Each of the plurality of insulating layers 10, 20, 30, and 40 may include an inorganic insulating material or an organic insulating material. For example, the first insulating layer 10, the second insulating layer 20, the third insulating layer 30, and the fourth insulating layer 40 may include inorganic insulating materials such as silicon oxide ($SiO_x$), silicon nitride ($SiN_x$), silicon oxynitride ($SiO_xN_y$), aluminum oxide ($Al_2O_3$), and aluminum nitride (AlN). In addition, the first insulating layer 10, the second insulating layer 20, the third insulating layer 30 and the fourth insulating layer 40 may include organic insulating materials such as an acrylic resin, an epoxy resin, a phenol resin, a polyamide resin, a polyimide resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, and a polymethyl methacrylate-polycarbonate synthetic resin. However, this is presented as an example, and the inventive concept is not limited thereto.

The fourth insulating layer 40 may have a light emitting element ED disposed thereon. The display panel DP according to an embodiment of the inventive concept may include the light emitting element ED. The display element layer DP-ED may include the light emitting element ED. The light emitting element ED may include a first electrode EL1, a second electrode EL2, and a functional layer EM disposed between the first electrode EL1 and the second electrode EL2. The first electrode EL1 and the second electrode EL2 may face each other. The functional layer EM may include an emission layer. The functional layer EM of the light emitting element ED may include an organic light emitting material or a quantum dot light emitting material.

The display element layer DP-ED may include a pixel defining film PDL disposed between a plurality of light emitting elements ED. The pixel defining film PDL may correspond to the non-light emitting area NPXA, and the light emitting elements ED may correspond to the light emitting area PXA. In other words, the pixel defining film PDL may be located in the non-light emitting area NPXA, and the light emitting elements ED may be located in the light emitting area PXA.

According to an embodiment of the inventive concept, the base substrate BS may have at least one through hole PEA defined therein. The through hole PEA may pass through the base substrate BS in parallel with the direction in which the third directional axis DR3 extends. The through hole PEA may pass through the base substrate BS in parallel with the thickness direction of the base substrate BS. The through hole PEA may be electrically connected to the connection electrode SD. For example, the through hole PEA may be connected to the connection electrode SD where the first insulating layer 10 and the base substrate BS meet. The through hole PEA may be electrically connected to the first pad PAD1. The first pad PAD1 and the connection electrode SD may be electrically connected through the through hole PEA.

More specifically, the conductive part CP of the through hole PEA may be electrically connected to the connection electrode SD. The conductive part CP of the through hole PEA may be electrically connected to the first pad PAD1. The connection electrode SD and the first pad PAD1 may be electrically connected through the conductive part CP of the through hole PEA. The conductive part CP may exhibit conductivity. The conductive part CP may include a metallic material. For example, the conductive part CP may include at least one of Ag and Cu. However, this is presented as an example, and a material included in the conductive part CP is not limited thereto.

According to an embodiment of the inventive concept, an auxiliary conductive part CPa may extend from the conductive part CP. The auxiliary conductive part CPa may extend in one direction from one side of the conductive part CP. For example, the auxiliary conductive part CPa may extend towards the center of the light emitting area PXA. The auxiliary conductive part CPa may be disposed at the lower side of the base substrate BS. The auxiliary conductive part CPa disposed at the lower side of the base substrate BS may overlap the first pad PAD1. For example, the auxiliary conductive part CPa may be provided between the lower side of the base substrate BS and the first pad PAD1. The auxiliary conductive part CPa may electrically connect the first pad PAD1 and the connection electrode SD. The auxiliary conductive part CPa may include the same material as the conductive part CP. According to an embodiment of the inventive concept, the auxiliary conductive part CPa may be disposed at the lower side of the base substrate BS and electrically connect the first pad PAD1 and the connection electrode SD. Accordingly, the number of wirings disposed at the lower side of the base substrate BS included in the display panel DP according to an embodiment of the inventive concept may be reduced. The wirings may be used to electrically connect components included in a display panel.

The display panel DP according to an embodiment of the inventive concept may include the through hole PEA such that the connection line CL, the first pad PAD1, the second pad PAD2, the chip-on film COF, the driving chip IC, etc. are disposed on a different layer from the circuit layer DP-CL. The circuit layer DP-CL disposed at the upper side of the base substrate BS, and the first and second pads PAD1 and PAD2 disposed at the lower side of the base substrate BS may be electrically connected through the conductive part CP of the through hole PEA.

The conductive part CP may be disposed on an inner surface of the through hole PEA. A resin part EP may be disposed inside the conductive part CP. The through hole PEA may include the resin part EP disposed inside the conductive part CR The resin part EP may fill the through hole PEA. The resin part EP may include a polymer resin. For example, the resin part EP may include an epoxy-based resin. However, this is presented as an example, and a polymer resin having physical properties similar to those of the base substrate BS may be applied as a material of the resin part EP in embodiments of the inventive concept. A polymer resin having a coefficient of thermal expansion (CTE) similar to the coefficient of thermal expansion (CTE) of the base substrate BS may be used as a material of the resin part EP in an embodiment of the inventive concept.

Referring to FIG. 5, on a cross section, the resin part EP may have a shape in which the width thereof increases in a direction towards an upper surface or a lower surface from the center. In the resin part EP, a width Wa of the center may be smaller than a width Wc of the upper surface and a width Wb of the lower surface. The center may correspond to a virtual center line LL. The distance between the upper surface of the base substrate BS and the virtual center line LL may be the same as the distance between the lower surface of the base substrate BS and the virtual center line LL. The distance between the virtual center line LL and each of the upper surface of the base substrate BS and the lower surface of the base substrate BS may be the same.

The widths Wa, Wb, and We of the resin part EP each may be parallel to a direction in which the first directional axis DR1 extends. The widths Wa, Wb, and Wc of the resin part EP each may be parallel to the virtual center line LL. On a cross section, the width Wa of the resin part EP may be adjacent to the center of the base substrate BS. On a cross section, the width Wb of the resin part EP may be adjacent to the lower surface of the base substrate BS. On a cross section, the width Wc of the resin part EP may be adjacent to the upper surface of the base substrate BS. The width Wb of the resin part EP adjacent to the lower surface of the base substrate BS and the width Wc of the resin part EP adjacent to the upper surface of the base substrate BS each may be greater than the width Wa of the resin part EP adjacent to the center of the base substrate BS.

According to an embodiment of the inventive concept, the widths Wa, Wb, and Wc of the resin part EP may be about 40 um to about 200 um. When viewed in a plane formed by the first directional axis DR1 and the second directional axis DR2 crossing the first directional axis DR1, the resin part EP may have a circular shape. The circular resin part EP may have an average diameter of about 40 um to about 200 um. For example, the widths Wa, Wb, and Wc of the resin part EP each may be about 40 um to about 100 um. However, this is presented as an example, and the embodiment of the inventive concept is not limited thereto.

In addition, on a cross section, the width Wd of the conductive part CP may be smaller than the widths Wa, Wb, and Wc of the resin part EP. The width Wd of the conductive part CP may be parallel to the direction in which the first directional axis DR1 extends.

The display panel DP according to an embodiment of the inventive concept includes the base substrate BS having the through hole PEA defined therein, and the circuit layer DP-CL and the first and second pads PAD1 and PAD2 may be disposed on the upper and lower sides of the base substrate BS. The circuit layer DP-CL, and the pads PAD1 and PAD2 may be electrically connected through the conductive part CP of the through hole PEA. Accordingly, the display panel DP according to an embodiment of the inventive concept may have a reduced non-display area.

According to an embodiment of the inventive concept, the display panel DP includes: a substrate BS having a through hole PEA, a conductive part CP disposed on an inner surface of the through hole PEA and a resin part EP in the through hole PEA and adjacent to the conductive part CP; a circuit layer DP-CL disposed at a first side of the substrate BS; and a pad PAD1 disposed at a second side of the substrate BS and electrically connected to the circuit layer DP-CL by the conductive part CP, wherein a width Wb/Wc of the through hole PEA is larger near the first side or the second side of the substrate BS than at a center Wa of the through hole PEA.

Hereinafter, a method for manufacturing a display panel according to an embodiment of the inventive concept will be described with reference to the accompanying drawings. The display panel DP of an embodiment described above may be manufactured according to the method for manufacturing a display panel hereinafter described.

Figure 6:
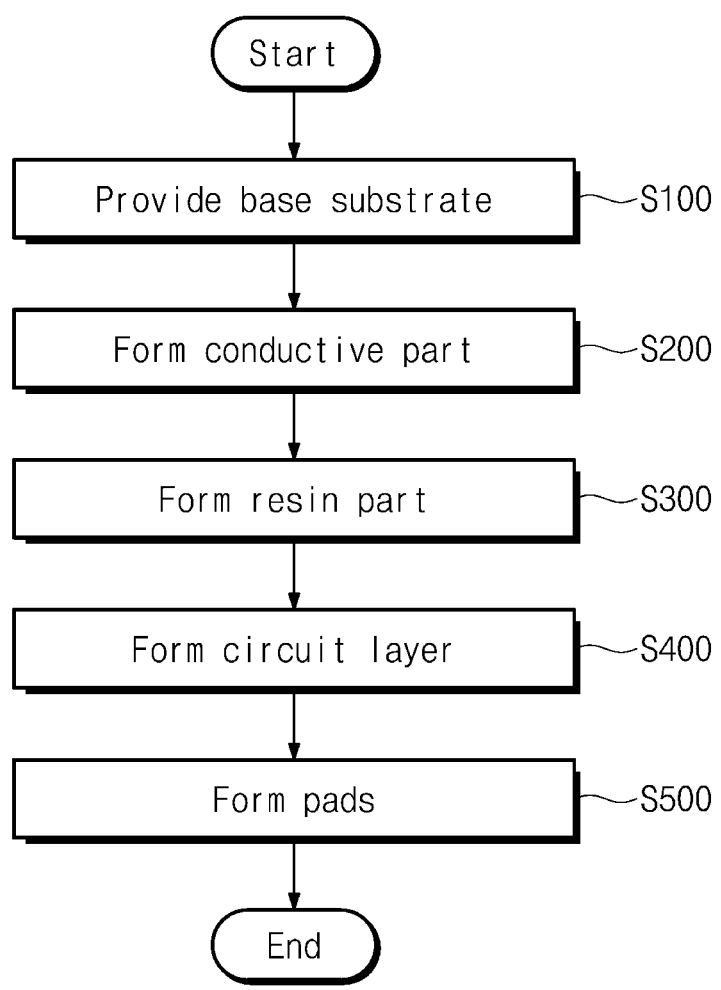
FIG. 6 is a flowchart illustrating a method for manufacturing a display panel according to an embodiment of the inventive concept.
Figure 7:
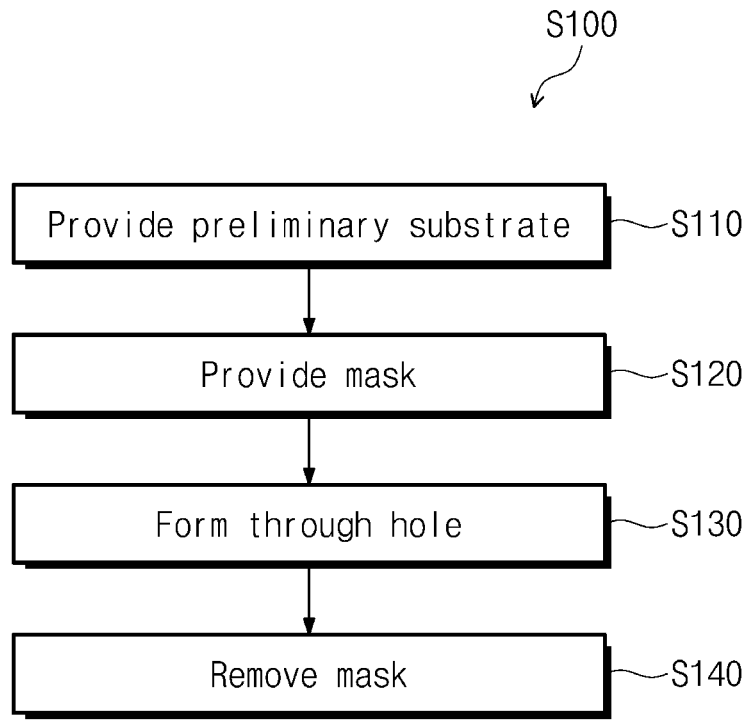
FIG. 7 is a flowchart illustrating a method for manufacturing a display panel according to an embodiment of the inventive concept.
Figure 8:
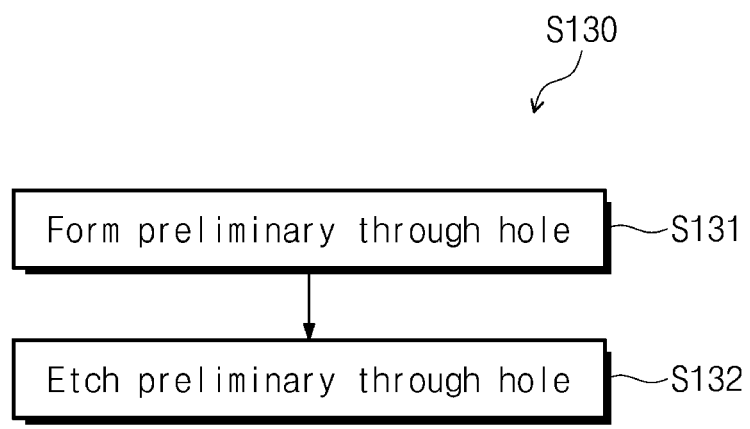
FIG. 8 is a flowchart illustrating a method for manufacturing a display panel according to an embodiment of the inventive concept.

FIGS. 6 to 8 are flowcharts each schematically illustrating a method for manufacturing a display panel of an embodiment of the inventive concept. FIGS. 9 to 12 are perspective views each illustrating steps in a method for manufacturing a display panel according to an embodiment of the inventive concept.

The method for manufacturing a display panel according to an embodiment of the inventive concept may include providing a base substrate (S100), forming a conductive part (S200), forming a resin part (S300), forming a circuit layer (S400), and forming pads (S500). According to an embodiment of the inventive concept, the providing of a base substrate (S100) may include providing a preliminary base substrate (S110), providing a mask (S120), forming a through hole (S130), and removing the mask (S140). In addition, the forming of the through hole (S130) may include forming a preliminary through hole (S131) and etching the preliminary through hole (S132).

Figure 9:
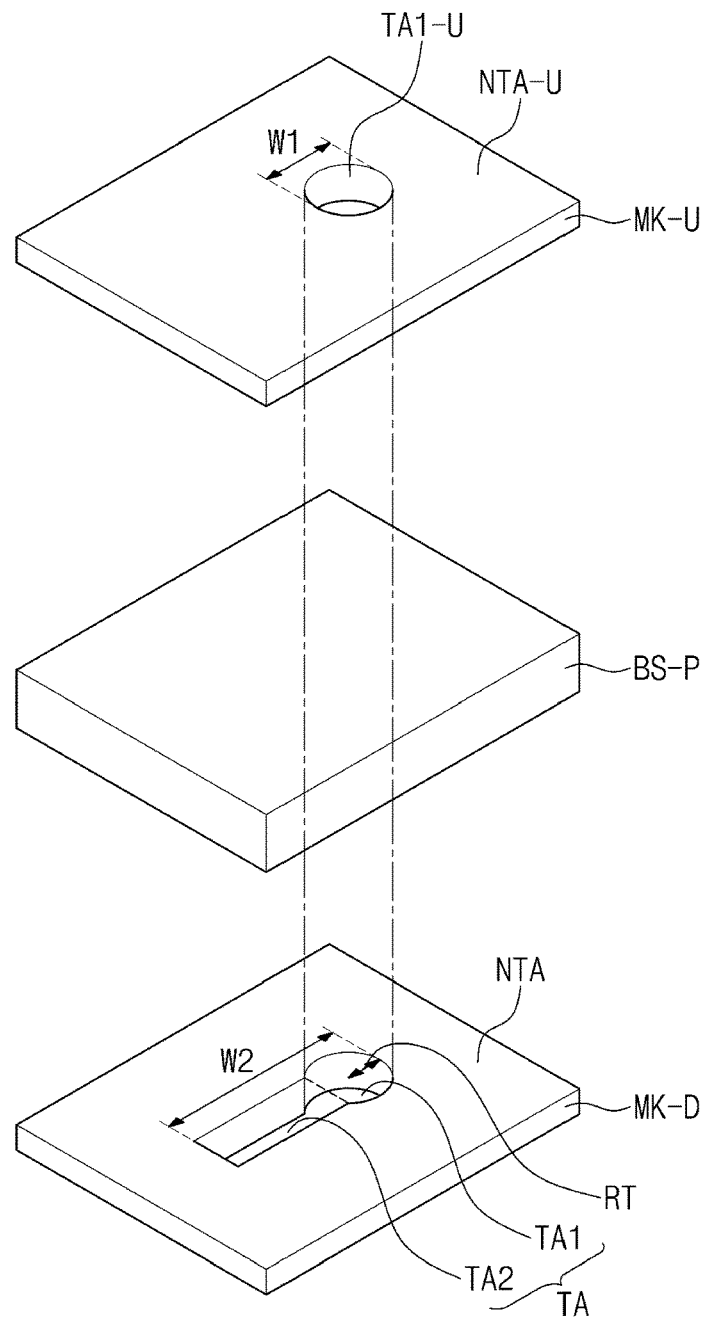
FIG. 9 is a perspective view illustrating a step in a method for manufacturing a display panel according to an embodiment of the inventive concept.
Figure 10:
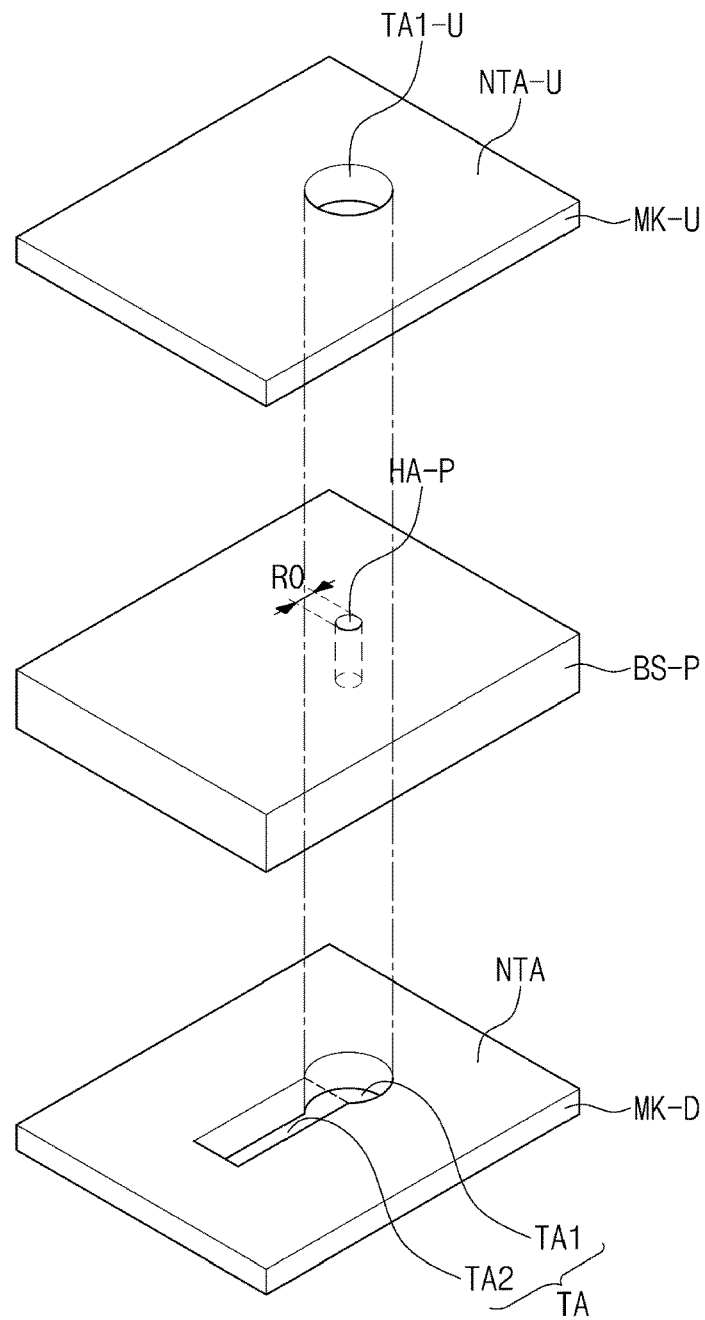
FIG. 10 is a perspective view illustrating a step in a method for manufacturing a display panel according to an embodiment of the inventive concept.
Figure 11:
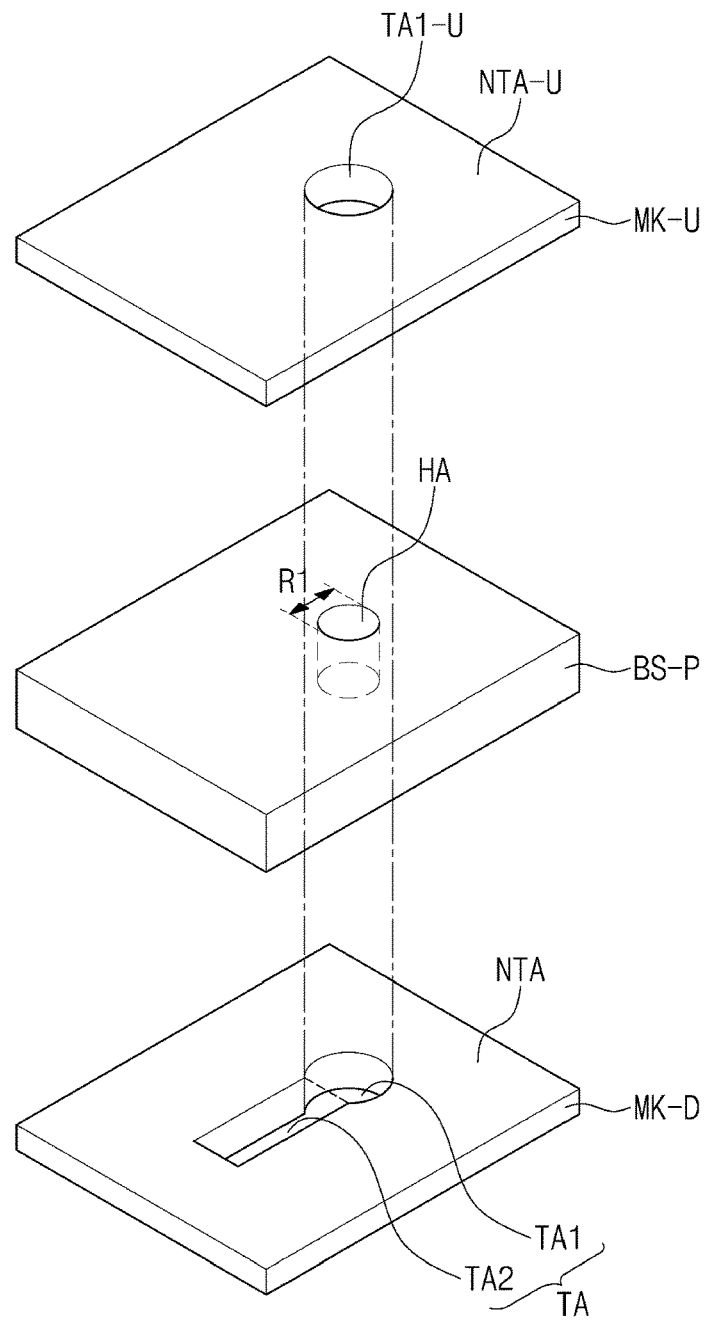
FIG. 11 is a perspective view illustrating a step in a method for manufacturing a display panel according to an embodiment of the inventive concept.

FIG. 9 illustrates providing masks MK-U and MK-D at each of upper and lower sides of a preliminary base substrate BS-P. The masks MK-U and MK-D may be directly provided on the upper and lower surfaces of the preliminary base substrate BS-P. The masks MK-U and MK-D may correspond to edges of the upper and lower surfaces of the preliminary base substrate BS-P.

The masks MK-U and MK-D may each include a dry film resist and a photo resist. The masks MK-U and MK-D may include transmission parts TA and TA1-U and non-transmission parts NTA and NTA-U. The transmission parts TA and TA1-U may be in the form that passes through the masks MK-U and MK-D to be open. In other words, the transmission parts TA and TA1-U may be openings in the masks MK-U and MK-D. The transmission parts TA and TA1-U may opened in a direction parallel to the direction in which the third directional axis DR3 extends. The transmission parts TA and TA1-U may be open in a direction parallel to the thickness direction of the preliminary base substrate BS-P.

The upper and lower surfaces of the preliminary base substrate BS-P may be partially exposed through the transmission parts TA and TA1-U of the masks MK-U and MK-D. The conductive part CP and the resin part EP described above may be formed from one area of the upper surface of the preliminary base substrate BS-P and one area of the lower surface of the preliminary base substrate BS-P exposed through the transmission parts TA and TA1-U. The area of the preliminary base substrate BS-P exposed through the transmission parts TA and TA1-U may correspond to the through hole PEA of the base substrate BS described above.

In each of the masks MK-U and MK-D provided at the upper and lower sides of the preliminary base substrate BS-P, the shapes of the transmission parts TA and TA1-U may be different. Shapes and areas of the transmission parts TA and TA1-U may be different on a plane formed by the first directional axis DR1 and the second directional axis DR2 crossing the first directional axis DR1. When viewed in a plane, the area of the transmission part TA1-U of the mask MK-U provided at the upper side of the preliminary base substrate BS-P may be smaller than the area of the transmission part TA of the mask MK-D provided at the lower side of the preliminary base substrate BS-P.

The transmission part TA of the mask MK-D provided at the lower side may include a first transmission part TA1 and a second transmission part TA2. The first transmission part TA1 may include a portion with a circumference having a first radius of curvature RT when viewed in a plane. The first transmission part TA1 may include two points on a line and a curve connected to the two points. The curve may be a part of the circumference.

The second transmission part TA2 may be connected at one side of the first transmission part TA1. One side of the first transmission part TA1 may include the two points on the line of the first transmission part TA1 described above, and the second transmission part TA2 may extend from the two points of the first transmission part TA1. When viewed in a plane, the second transmission part TA2 may have a rectangular shape. A line segment extending in one direction from the two points of the first transmission part TA1 may be included in the second transmission part TA2. Two long sides among the three sides of the second transmission part TA2 each may extend from the two points of the first transmission part TA1. However, this is presented as an example, and the first transmission part TA1 and the second transmission part TA2 may have the same shape. For example, the transmission part TA of the mask MK-D including the first transmission part TA1 and the second transmission part TA2 may have an entirely oval or rectangular shape.

The transmission part TA1-U of the mask MK-U provided at the upper side of the preliminary base substrate BS-P may correspond to the first transmission part TA1 of the mask MK-D provided at the lower side of the preliminary base substrate BS-P. The transmission part TA1-U of the mask MK-U provided at the upper side may have a circular shape with the first radius of curvature RT when viewed in a plane. One edge of the mask MK-U provided at the upper side and one edge of the mask MK-D provided at the lower side may overlap. One edge of the mask MK-U provided at the upper side and one edge of the mask MK-D provided at the lower side each may be parallel to a direction in which the third directional axis DR3 extends.

A first width W1 of the transmission part TA1-U included in the mask MK-U provided at the upper side is smaller than a second width W2 of the transmission part TA included in the mask MK-D provided at the lower side. The first width W1 and the second width W2 each may be parallel to the direction in which the second directional axis DR2 extends, and may be perpendicular to the direction in which the third directional axis DR3 extends. When viewed in a plane formed by the first directional axis DR1 and the second directional axis DR2 crossing the first directional axis DR1, the first width W1 and the second width W2 each may refer to a maximum linear distance within the transmission parts TA and TA1-U. The first width W1 and the second width W2 each may refer to a maximum linear distance between one point and another point included in the transmission parts TA and TA1-U when viewed in a plane.

According to an embodiment of the inventive concept, the second width W22 may be about three to five times greater than the first width W1. For example, the second width W2 may be three times greater than the first width W1. In addition, the second width W2 may be five times greater than the first width W1. However, this is presented as an example, and the inventive concept is not limited thereto.

The first width W1 may be two times greater than the first radius of curvature RT described above. The first width W1 may be a diameter of a circle. The second width W2 may include the width of the first transmission part TA1 and the width of the second transmission part TA2. The widths of the first transmission part TA1 and the width of the second transmission part TA2 each may be parallel to the direction in which the first directional axis DR1 extends.

The non-transmission parts NTA and NTA-U each may cover the upper and lower surfaces of the preliminary base substrate BS-P. The non-transmission parts NTA and NTA-U may cover the upper and lower surfaces of the preliminary base substrate BS-P except for one area of the upper surface and one area of the lower surface corresponding to the transmission parts TA and TA1-U. The non-transmission parts NTA and NTA-U may provide an etching solution only to one area of the preliminary base substrate BS-P corresponding to the transmission parts TA and TA1-U in the forming of the through hole (S130).

Subsequently, the through hole PEA (FIG. 5) may be formed to correspond to the transmission parts TA and TA1-U. The forming of the through hole (S130) may include forming a preliminary through hole in the preliminary base substrate BS-P (S131) and etching the preliminary through hole (S132). When a preliminary through hole HA-P (FIG. 10) is formed, a laser may be provided to the preliminary base substrate BS-P. A laser may be provided to an area of the preliminary base substrate BS-P exposed through the transmission parts TA and TA1-U. A cylindrical preliminary through hole HA-P may be formed in an area of the preliminary base substrate BS-P provided with a laser. Alternatively, an area of the preliminary base substrate BS-P provided with a laser may have its surface modified. The area whose surface is modified may correspond to the preliminary through hole HA-P, and may be circular when viewed in a plane.

According to an embodiment of the inventive concept, the preliminary through-hole HA-P may have an average diameter R0 of about 0.1 um to about 10 um. For example, when the cylindrical preliminary through-hole HA-P is formed, the preliminary through hole HA-P may have an average diameter R0 of about 1 μm to about 10 μm. The preliminary through hole HA-P formed by having the surface of the preliminary base substrate BS-P modified may have an average diameter R0 of about 0.1 μm to about 1 μm. However, this is presented as an example, and the inventive concept is not limited thereto.

Thereafter, the preliminary through hole HA-P may be etched. For example, an etching solution may be provided in the preliminary through hole HA-P, and the etched through hole HA (FIG. 11) may be formed through a wet etching process. An average diameter R1 of the etched through hole HA may be greater than an average diameter R0 of the preliminary through hole HA-P. For example, the etching solution may be hydrogen fluoride (HF) or potassium hydroxide (KOH). However, this is presented as an example, and the types of the etching solution are not limited thereto.

Metallic ink may be provided in the preliminary base substrate BS-P. Metallic ink may be provided to an inner surface of the etched through hole HA included in the preliminary base substrate BS-P. The conductive part CP may be formed by the providing of metallic ink. The metallic ink includes a conductive material and a solvent, and the solvent may be removed through an annealing process. The metallic ink may include at least one of silver (Ag) and copper (Cu). However, this is presented as an example, and the types of the conductive material included in the metallic ink are not limited thereto.

In addition, metallic ink may be provided on the lower surface of the preliminary base substrate BS-P corresponding to the second transmission part TA2. The auxiliary conductive part CPa (FIG. 5) described above may be formed on the lower surface of the preliminary base substrate BS-P corresponding to the second transmission part TA2. In addition, the connection line CL (FIG. 3) described above may be formed together with the auxiliary conductive part CPa. The mask disposed at the lower side of the preliminary base substrate BS-P may include a pattern for forming the connection line CL. Accordingly, when the metallic ink for forming the conductive part CP and the auxiliary conductive part CPa is provided, the connection line CL disposed at the lower side of the base substrate BS may be formed together with the auxiliary conductive part CPa.

Figure 12:
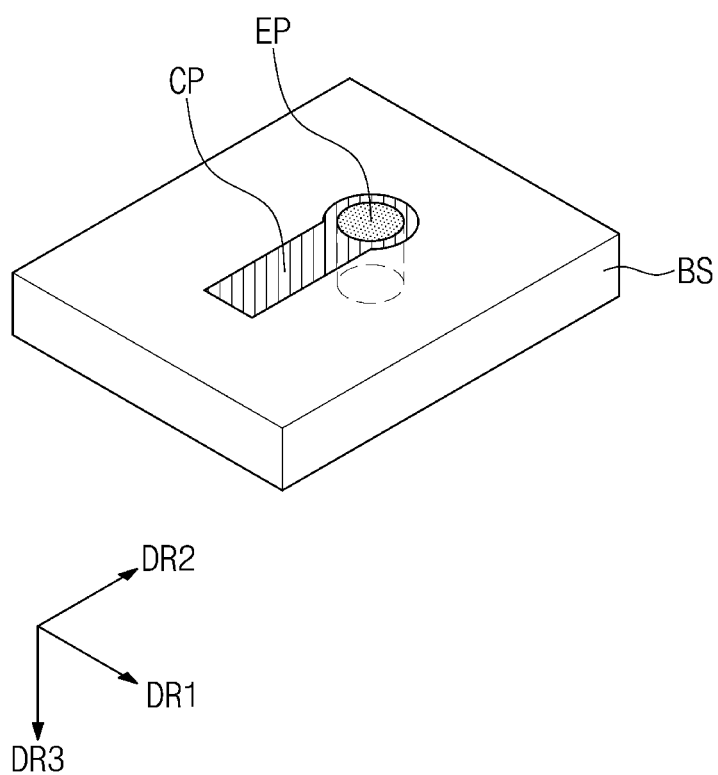
FIG. 12 is a perspective view illustrating a step in a method for manufacturing a display panel according to an embodiment of the inventive concept.

The inside of the conductive part CP may be filled with a polymer resin. The polymer resin may be applied to form the resin part EP (FIG. 12). The polymer resin may have properties similar to those of the preliminary base substrate BS-P. For example, the coefficient of thermal expansion (CTE) of the polymer resin may be a value similar to the coefficient of thermal expansion (CTE) of the preliminary base substrate BS-P. For example, the resin part EP may include an epoxy-based resin. The properties of the epoxy-based resin and the properties of the glass substrate may be similar. Accordingly, the resin part EP including the polymer resin may not be deformed due to heat in the forming of the circuit layer (S400).

According to an embodiment of the inventive concept, the forming of the conductive part CP may further include a plasma treatment process. Before the metallic ink is provided, one area of the preliminary base substrate BS-P may be plasma-treated. The inner side of the preliminary through hole HA-P may be plasma-treated. In addition, an area of the preliminary base substrate BS-P corresponding to the second transmission part TA2 may be plasma-treated. One area of the preliminary base substrate BS-P corresponding to the second transmission part TA2 may correspond to the auxiliary conductive part CPa described above. One area of the preliminary base substrate BS-P is subjected to the plasma treatment, and accordingly, one area of the preliminary base substrate BS-P may exhibit hydrophilicity. The inner side of the preliminary through hole HA-P and an area of the preliminary base substrate BS-P corresponding to the second transmission part TA2 may exhibit hydrophilicity. Accordingly, the bonding force between the conductive material included in the metallic ink and the preliminary base substrate BS-P may be enhanced.

The method for manufacturing a display panel according to an embodiment of the inventive concept may include providing a base substrate, forming a conductive part, forming a resin part, forming a circuit layer, and forming pads. The base substrate has a through hole defined therethrough, and metallic ink may be provided on an outer surface of the through hole to form the conductive part. Accordingly, the circuit layer and the pads may be electrically connected through the conductive part. In addition, the inside of the conductive part may be filled with a polymer resin having properties similar to those of the base substrate to form the resin part. Accordingly, deformation of the resin part may be prevented in the forming of the circuit layer.

Figure 13:
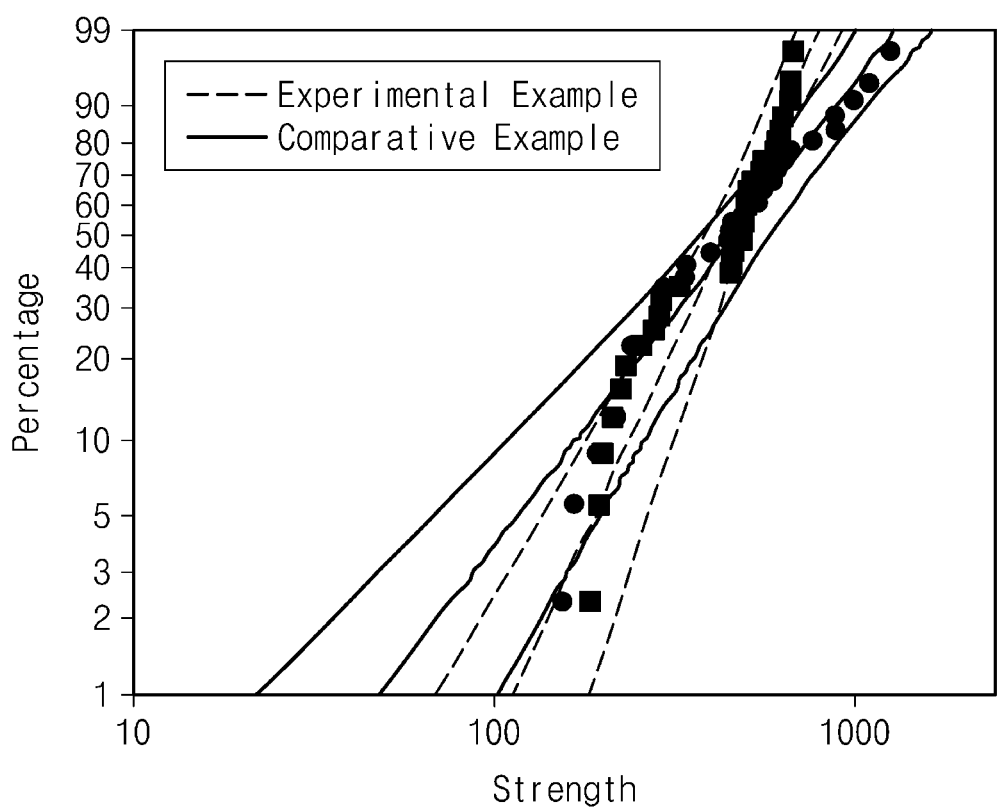
FIG. 13 is a graph evaluating the damage reliability of Comparative Examples and Experimental Examples of the inventive concept.

FIG. 13 and Table 1 below show evaluation on damage reliability for substrates of Comparative Examples and Experimental Examples of the inventive concept. Graph 13 shows the evaluation of the damage reliability of the substrates of Comparative Examples and Experimental Examples using a Weibull distribution. Circular rings provided at each of the upper and lower sides of the substrates of Experimental Examples and Comparative Examples are used to evaluate the strength of the substrates (e.g., a Ring On Ring Test). The substrates of Comparative Examples have no through holes formed, and the substrates of Experimental Examples have a plurality of through holes formed. In the substrates of Experimental Examples, through holes were formed in the same manner as in the forming of through holes included in the method for manufacturing a display panel according to an embodiment of the inventive concept, and a pitch between the plurality of through holes is about 630 μm. The plurality of through holes are circular when viewed in a plane, and the distance between the center of the circle in one hole and the center of the circle in the other hole corresponds to the pitch between the through holes. In addition, on the upper surface of Experimental Example substrates, the through hole has a diameter of about 180 um, and on the lower surface, the through hole has a diameter of about 50 um. The substrates of Comparative Examples and Experimental Examples each have a length of about 1 inch in width and length when viewed in a plane, and for each, 30 substrates were used.

In FIG. 13, the "percentage" indicates the distribution of substrates having low damage reliability to substrates having high damage reliability out of 30 substrates. When the percentage is 1, the damage reliability is high, and when the percentage is 99, the damage reliability is low.

In Table 1, the "scale parameter" corresponds to the Weibull characteristic strength, and indicates the strength at which the substrates corresponding to a percentage of about 63.2 to about 100 out of the 30 substrates are damaged. In addition, the "B10" indicates the strength at which substrates corresponding to a percentage of 90 to 100 out of the 30 substrates are damaged. The "shape parameter" indicates the shape parameter of the Weibull distribution, and being closer to 3 indicates the normal distribution.

TABLE 1

| Type | Scale parameter | B10 | Shape parameter |
|---|---|---|---|
| Comparative Example | 566.0 | 169.3 | 1.864 |
| Experimental Example | 490.9 | 239.1 | 3.129 |

Referring to Table 1, it is seen that the value of the scale parameter is greater in Comparative Example (e.g., 566.0) than in Experimental Example (e.g., 490.9), but the value of B10 is greater in Experimental Example than in Comparative Example. In addition, it is seen that the shape parameter of Experimental Example is close to 3 (e.g., 3.129) whereas the shape parameter of Comparative Example is close to about 2 (e.g., 1.864). Compared with the substrate of Comparative Example, it is seen that the substrate of Experimental Example whose shape parameter is close to 3 exhibits uniform strength characteristics. Therefore, it is determined that the strength is maintained in the substrate of Experimental Example in which the through holes are formed compared to the substrate of Comparative Example in which the through holes are not formed.

The display panel according to an embodiment of the inventive concept may include a base substrate having a through hole passing therethrough, a circuit layer disposed at an upper side of the base substrate, and a pad disposed at a lower side of the base substrate. A conductive part may be disposed on an inner surface of the through hole, and a resin part may be disposed on an inner surface of the conductive part. A circuit layer and a pad may be electrically connected through the conductive part of the base substrate. Accordingly, in the display panel according to an embodiment of the inventive concept, the circuit layer and the pad each may be disposed on different layers. By providing the pad under the base substrate, the non-display area may be reduced in size. Thus, a display device including the display panel according to an embodiment of the inventive concept may have a reduced non-display area.

The method for manufacturing a display panel according to an embodiment of the inventive concept includes forming a conductive part and a resin part on a base substrate having a through hole passing therethrough, and in the forming of the resin part, a polymer resin having physical properties similar to those of the base substrate may be provided. Accordingly, deformation of the through hole may be prevented in the forming of the circuit layer on the base substrate.

A display panel according to an embodiment of the inventive concept includes a base substrate having a through hole provided therein, and may thus have a reduced non-display area.

A method for manufacturing a display panel according to an embodiment of the inventive concept includes forming a conductive part and a resin part, and may thus exhibit properties in which the strength of a glass substrate is maintained.

A display device according to an embodiment of the inventive concept includes a display panel having a reduced non-display area, and may thus exhibit increased display quality.

Although the inventive concept has been described with reference to embodiments of the inventive concept, it will be understood that the inventive concept is not limited to these embodiments but various changes and modifications can be made by those skilled in the art without departing from the spirit and scope of the inventive concept.

What is claimed is:

1. A method for manufacturing a display panel, the method comprising:
    forming a through hole in a base substrate;
    providing metallic ink to an inner surface of the through hole passing through the base substrate to form a conductive part;
    filling the inside of the conductive part with a polymer resin to form a resin part;
    forming a circuit layer at an upper side of the base substrate; and
    forming a pad at a lower side of the base substrate, wherein the pad overlaps the through hole,
    wherein the forming of the through hole in the base substrate comprises:
    arranging an upper mask including a transmission part and a non-transmission part at an upper side of a preliminary base substrate, and a lower mask including a transmission part and a non-transmission part at a lower side of the preliminary base substrate;
    forming the through hole in the preliminary base substrate, wherein the through hole corresponds to the transmission part of each of the upper and lower masks; and
    removing the upper and lower masks.

2. The method of claim 1, wherein an area of the transmission part of the lower mask at the lower side of the preliminary base substrate is larger than an area of the transmission part of the upper mask at the upper side of the preliminary base substrate.

3. The method of claim 1, wherein when viewed in a plane, the transmission part of at least one of the upper and lower masks comprises a first transmission part that has a portion with a circumference having a first radius of curvature.

4. The method of claim 3, wherein the transmission part of the at least one of the upper and lower masks further comprises a second transmission part having a square shape when viewed in a plane and the second transmission part is connected at one side of the first transmission part.

5. The method of claim 4, wherein the lower mask at the lower side of the preliminary base substrate comprises the first transmission part and the second transmission part, and
    the upper mask at the upper side of the preliminary base substrate comprises the first transmission part.

6. The method of claim 4, wherein the upper mask at the upper side of the preliminary base substrate does not comprise the second transmission part.

7. The method of claim 1, wherein when viewed in a cross section perpendicular to the thickness direction of the preliminary base substrate, one edge of the upper mask at the upper side of the preliminary base substrate and one edge of the lower mask at the lower side of the preliminary base substrate overlap each other.

8. The method of claim 1, wherein a second width of the transmission part of the lower mask at the lower side of the preliminary base substrate is three to five times greater than a first width of the transmission part of the upper mask at the upper side of the preliminary base substrate, and the first width and the second width each correspond to a width in a direction perpendicular to the thickness direction of the preliminary base substrate.

9. The method of claim 1, wherein when viewed in a plane, an area of the through hole is smaller than an area of the transmission part of at least one of the upper and lower masks.

10. The method of claim 1, wherein the forming of the through hole comprises forming a preliminary through hole with a laser and etching the preliminary through hole.

11. The method of claim 1, wherein when viewed in a plane, the preliminary through hole is circular and has an average diameter of about 0.1 urn to about 10 um.

12. The method of claim 1, wherein the metallic ink comprises a conductive material and a solvent, and the forming of the conductive part comprises removing the solvent.

13. The method of claim 1, wherein the forming of the conductive part further comprises performing plasma treatment on the inner surface of the through hole.

\* \* \* \* \*